May 3, 1966 P. N. EVERETT ETAL 3,249,829

ENCAPSULATED DIODE ASSEMBLY

Filed May 18, 1962

2 Sheets-Sheet 1

INVENTORS
PATRICK N. EVERETT
BRIAN DALE
JOHN ROYAN

BY Ezekiel Wolf, Wolf & Greenfield

ATTORNEYS

May 3, 1966 P. N. EVERETT ETAL 3,249,829

ENCAPSULATED DIODE ASSEMBLY

Filed May 18, 1962

2 Sheets-Sheet 2

INVENTORS
PATRICK N. EVERETT
BRIAN DALE
JOHN ROYAN

BY Ezekiel Wolf, Wolf & Greenfield

ATTORNEYS 3,249,829

ENCAPSULATED DIODE ASSEMBLY

Patrick N. Everett, Wakefield, Brian Dale, West Peabody, and John Royan, Wakefield, Mass., assignors to Transitron Electronic Corporation, Wakefield, Mass., a corporation of Delaware Filed May 18, 1962, Ser. No. 195,792
5 Claims. (Cl. 317—234)

Figure 1:
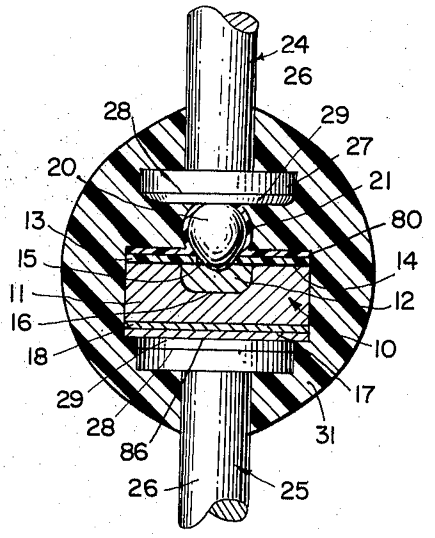

The present invention relates to semiconductive devices, and more particularly to an improved planar-type semiconductive structure useful in diode constructions.

There is a need for improved and less expense techniques in the production of semiconductive devices and in particular miniature semiconductive devices.

Attempts have been made to manufacture planar-type diodes using batch production techniques on certain steps in the manufacturing process. These attempts have related to a dipping process for the batch formation of ohmic contacts at spaced positions on sheets of semiconductive material which are later cut into semiconductive wafers. In addition attempts have been made to form planar-type diodes by attachment of gold beads by a thermal compression method. These techniques have proved unsatisfactory for a variety of reasons.

Accordingly, it is an object of the present invention to provide semiconductive devices, as for example miniature diodes in a more efficient and less expensive manner than heretofore possible.

An object of the present invention is to provide a miniature semiconductive device of rugged construction, substantial mechanical strength and a high degree of reliability.

A further object of the present invention is to provide a planar-type diode having significant mechanical strength and reliability and low cost of manufacture.

One further object of this invention is to provide a planar-type diode having an ohmic contact formed by thermoelectrochemical deposition technique.

In the present invention the preferred method of forming planar-type semiconductor devices includes applying an electrically insulating layer, preferably an oxide mask, having a multiplicity of apertures over the surface of a sheet of semiconductor material. Rectifying junctions are formed through these apertures. Metal beads, preferably tin or tin alloy are then deposited by thermoelectric-chemical deposition from solution in the apertures in electrical contact with the surface of the semiconductor material. A coating, preferably of varnish, is then formed over the insulating layer with the beads engaged by this coating and projecting through it. The sheet is treated on its other surface to facilitate the attachment of leads in a subsequent operation. Following this, the sheet is diced into individual wafers, each containing at least one of the beads. The individual wafers are then secured, preferably by solder, to adjacent ends of a pair of leads. The construction is thereafter encapsulated in a suitable potting compound.

Diodes made in accordance with the present invention also provide an improved construction. These devices each include a pair of headed leads each comprising a length of conductive wire with integral heads at the ends. These heads are formed with parallel facing surface areas larger than the cross sectional areas of the wires and lying in planes normal to the length of the wires. A wafer of semiconductor material covered with an insulating mask with an aperture thereon and at least one rectifying junction formed in the material is positioned in a plane parallel to and intermediate these surface areas. A metallic bead, preferably tin, having a melting point lower than the semiconductor material is deposited by thermo-electrochemical deposition means in the aperture of the mask and is electrically connected to the surface of the semiconductor material. The surface areas of the lead heads are soldered, one to the metallic bead and the other to a surface of the wafer opposite the bead. The structure is encapsulated in a suitable potting compound, preferably an epoxy resin.

Figure 2:
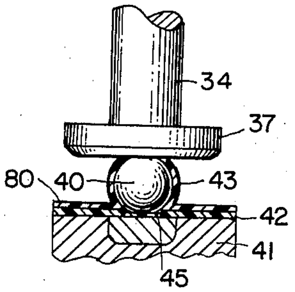
Figure 3:
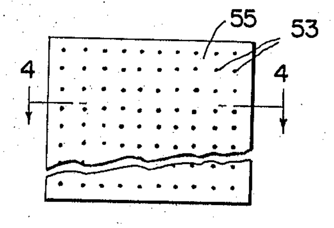
Figure 4:
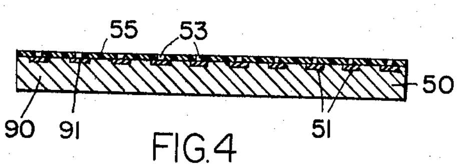
Figure 5:
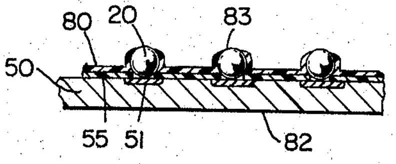
Figure 6:
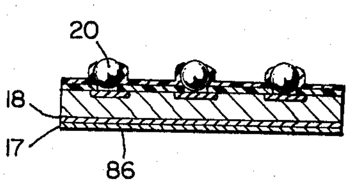
Figure 7:
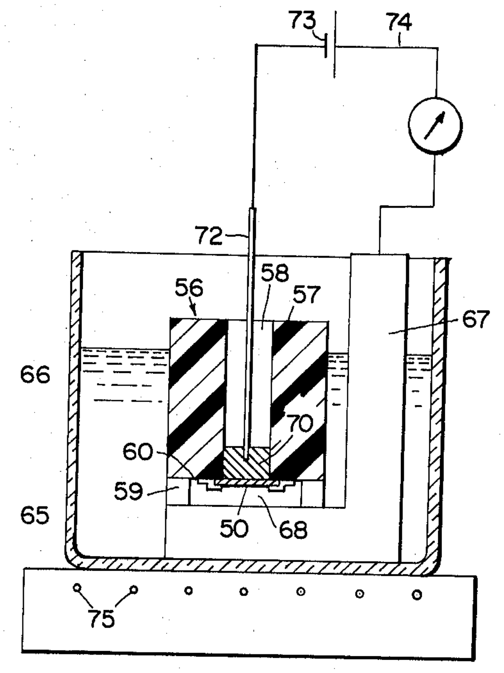
Figure 8:
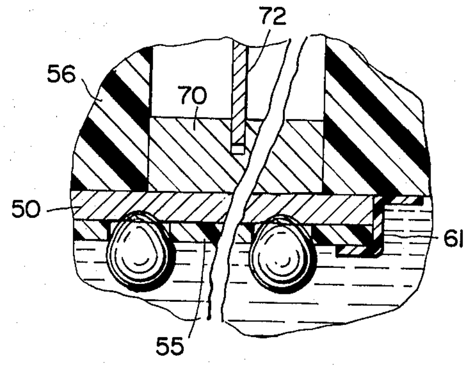

These and other objects and advantages of the present invention will be more clearly understood when considered in conjunction with the accompanying drawings, in which:

FIG. 1 is a schematic cross sectional view of a diode formed in accordance with the present invention, FIG. 2 is a schematic detail of a modification of the embodiment shown in FIG. 1, FIG. 3 is a planar view of a sheet of treated semiconductor material illustrating a step in the fabrication of a device as illustrated in FIG. 1, FIG. 4 is a cross sectional view taken along the line 4—4 of FIG. 3, FIG. 5 is a cross sectional view corresponding to the view of FIG. 4 but after further treatment of the semiconductor sheets, FIG. 6 is a view corresponding to that of FIG. 5, but after a still further step in the fabrication of a device as illustrated in FIG. 1, FIG. 7 is a schematic diagram of an apparatus used in the present invention, and FIG. 8 is an enlarged detail of a portion of the device illustrated in FIG. 7.

Reference is first made to the embodiment of the invention used in connection with the planar-type diode shown in FIG. 1.

In this construction a semiconductive wafer 10, preferably germanium, is formed with portions or bodies 11 and 12 of opposed conductivity types. For example, portion 11 may comprise a P-type conductivity body, while portion 12 comprises an N-type conductivity body. These types may be determined by doping the semiconductor body with impurities of the third and fifth column of the periodic table in a known manner. An electrically insulating layer 13 is bonded or otherwise secured to a surface 14 of the semiconductor wafer 10. This layer 13 is formed with an aperture 15. The layer 13 may comprise a silicon monoxide or silicon dioxide mask or other electrically insulating layer. The wafer 10 with its rectifying junction 16 and the insulating layer or mask 13 with its aperture 15 may be formed by known techniques such as illustrated for example in United States Letters Patent No. 2,802,760, issued August 19, 1957, for an invention in "Oxidation of Semiconductive Surfaces for Controlled Diffusion," by L. Derick et al.

A metal bead 20 is positioned in the aperture 15 in electrical contact with the portion 12 of the semiconductor wafer 10. The bead 20 is preferably formed of tin but may comprise under proper conditions of fabrication, other metals, including indium, gold, aluminum, cadmium, gallium, silver, zinc, lead and antimony as well as alloys of the foregoing metals. The particular metal or alloy selected depends upon the particular process or fabrication used, and the parameters desired.

The bead 20 is secured in position by a coating 21 covering the surface of the insulating layer 13 remote from the surface 14 of the semiconductor wafer. This coating engages the periphery of the bead with a portion of the bead 20 projecting through the coating 21. This coating functions as a moisture resistant barrier and as a means for holding the bead securely in electrical contact with the wafer 10. This coating may be formed of a water resistant varnish such as a silicone resin varnish or other organic silicone water resistant varnish.

The other surface 18 of the semiconductor wafer 10 has a layer of indium alloyed to it with a layer 17 of gold alloyed to the indium. Other systems than indium may be used. For example, gallium may be substituted for indium. The purpose of these alloyed layers 17 and 18 is to avoid oxidation of the wafer 10 and to facilitate the contacting of the lead in a low ohmic connection.

The leads 24 and 25 are formed with conductive wides 26 in longitudinal alignment with integral heads 27 extending substantially normal to the wires 26 and having inwardly facing surface areas 28 larger than the cross sectional area of the wires 26 with these surface areas 28 lying in planes normal to the length of the wire. The surface areas 28 are soldered with a suitable solder, preferably comprising a lead-tin solder 29. The bead 20 has an exposed surface area soldered by means of the solder 29 to the lead 24. The lead 25 is soldered to the gold layer 17 by means of the solder 29 on its surface area.

The construction is encapsulated within a bead 31 of a suitable potting compound, such for example as an epoxy resin. This bead encapsulates the entire ends, including the integral heads, of the leads 24 and 25 and lies in intimate contact with a portion of the length of wire 26 of the leads so as to form a relatively tight and compact seal.

In a preferred construction, the bead 20 preferably has a cross sectional diameter of between 3 and 10 mils, but preferably has a diameter 5 mils. The insulating layer 14 may be of any thickness desired, but a thickness of between 0.02 mil and 0.10 mil is desired. The diffused body or portion 12 preferably should have a depth of greater than .3 mil. The germanium layer 10 may have a thickness of between preferably .5 mil and 20 mils depending upon the particular device desired. If epitaxial germanium (or silicon), is used the epitaxial grown layer should be somewhat more than .3 mil thick to accommodate the diffused portion 12 and the substrate region may be up to 20 mils, or if desired more. The diameter of the aperture 15 should preferably not exceed approximately 5 mils.

While the foregoing construction describes a preferred embodiment of the invention, particularly useful in germanium diodes, the construction may be modified for use in devices made with silicon semiconductive material. In this structure, illustrated in FIG. 2, the arrangement of the lead 34, head 37, semiconductive wafer 41, masking layer 42 and coating 43 corresponds with the corresponding elements described in connection with FIG. 1. The materials used, however, may differ. The wafer 41 is formed of silicon having a rectifying junction. However, in this modification the metal bead 40 which may also comprise a bead of tin, is electrically connected to the semiconductor wafer 41 through an intermediate layer 45 of metal, preferably gold . This layer of metal which preferably is less than .1 mil thick, functions as a wetting agent. In place of gold, silver, aluminum and nickel are also useful as wetting agent for silicon and tin. The construction of this silicon diode is otherwise similar to the construction of the diode described in FIG. 1. While silicon semiconductor devices are normally designed for high temperature operation, the silicon diode illustrated in FIG. 2 is not a high temperature device. However, it does have some features such as lower leakage currents, which render it preferable in certain instances to germanium semiconductor diodes of the type illustrated in FIG. 1.

The process of this invention will be described in connection with an embodiment for making germanium diodes. In this process of forming diodes in accordance with the present invention, a sheet 50 of semiconductive germanium material is formed with a plurality of rectifying junctions. The sheet 50 may have any length and width dimensions and any number of rectifying junctions 51, depending upon the number of wafers to be formed. These rectifying junctions 51 are preferably formed by an oxide masking technique described in the L. Derick patent, supra in which an oxide mask 55 is deposited on the sheet 50. In a preferred embodiment the oxide mask 55 preferably comprises a silicon dioxide layer with a thickness of between .02 mil and .10 mil. The apertures 53 which are etched in the mask in accordance with the techniques described in the L. Derick patent, should preferably have the diameter of approximately 3 mils. A typical sheet of semiconductor material 50 may be formed with an oxide layer or mask 55 having 844 holes 53 per square inch formed therein.

A jig 56, illustrated in FIGS. 7 and 8 is formed of an inert material such as a high polymer of tetrafluoroethylene Teflon. This jig may be provided with an annular body 57 having a longitudinally extending aperture 58 formed therein. A plurality of legs 59 are provided at the lower end of the jig 56 for supporting its lower surface 60 in the spaced relation, to the bottom of the legs 59. The semiconductor body 50 having an apertured oxide mask as illustrated in FIG. 4 is secured to the bottom surface 60 of the jig. This sheet 50 is secured with the oxide mask 55 remote from the bottom wall 60 of the jig. The sheet 50 is sealed by suitable means such for example as an adhesive tape 61 formed with a high polymer tetrafluoroethylene tape such as Teflon to the lower surface 60.

The jig 56 is positioned in an electrochemical bath 65 suitably contained within a tank 66. The jig 56 is supported in spaced relation to an anode comprising preferably a carbon anode 67 which may have an L-shape The space 68 between the sheet 50 and the anode 67 should be carefully selected, with the space depending upon the amount of deposition to be obtained and the rate at which deposition is to be effected. A quantity of mercury 70 is positioned within the aperture 58 and an electric circuit is completed through the lines 72 electrically connected to the mercury at one end and a power source 73 at the other, and the line 74 connected at one end to the power source 73 and at the other to the carbon anode 67. Heating means 75 are provided for heating the fluid 65. The mercury 70 forms an electrical connection between the line 72 and the sheet 50. This sheet 50 functions as a cathode in the solution with the carbon block 67 functioning as the anode.

The electrochemical bath 65 preferably comprises a mixture of glycerine, a tin salt such as stannous chloride and ammonium chloride. A preferred composition of this bath provides by weight of constituents, 80% glycerine, 12% stannous chloride and 8% ammonium chloride. These percentages are not critical and may be varied with varying results. For example, the ammonium chloride functions primarily as a flux agent which wets the surface of the semiconductor. Consequently, while ammonium chloride is desirable in the electrochemical bath, it may not be necessary in every instance. The glycerine functions as a nonvolatile carrier at temperatures of 185° C. or thereabouts. Glycerine is used because it has a high boiling point, and the metal salt may be dissolved in it. Other solutions such as set forth for example in the Journal of Electrochemical Society, October 1961 edition, in an article entitled "Electrodeposition of Molten Metals and Alloys in Glycerine Solutions" by George L. Schnable may also be used.

It is important that the tin, on precipitating from solution, assumes a molten state. Therefore, the electrochemical bath 65 is heated to a temperature preferably 30° C. to 60° C. below the melting point of the metal, of the salt, or if a mixture of metals is used, below the eutectic point of the alloy. In some cases the temperature should be high enough so that the junctions are nonrectifying. It may be noted that at room temperature rectifying junctions exist within the semiconductor sheet 50. Each junction between portion 50 and portion 51 in FIG. 4 is a rectifying junction. If the main portion 50 is P-type, and the smaller portions 51 are N-type, the rectifying junction is such as to prevent or hinder plating current. Thus the elevated temperature of the electrochemical bath serves in some cases, not only to aid in depositing the tin in molten form on the semiconductor device, but also to render the junction substantially nonrectifying. This would not be if the main portion 50 were N-type. In the case of an electrochemical bath containing a tin salt the temperature of the bath is maintained approximately 30° C. to 60° C. below the melting point of the tin. The temperature of the electrochemical bath is preferably maintained in the foregoing example at approximately 185° C. A voltage of, for example, 30 volts D.C. from voltage source 73 is established across the cathode and anode sufficient to cause precipitation of the tin from the solution onto the semiconductive sheet 50 at the apertures 53. Although the temperature of the bath is somewhat below the melting point of the metal, local heating action takes place in the region of the apertures 53. This local heating action raises the temperature at the aperture to above the eutectic or melting point of the metal or metals. The metal or alloy is thereby deposited in liquid phase onto the exposed regions of the sheet 50 at apertures 53. Due to surface tension effects, the deposited material assumes shapes of spheres or beads 20. Some alloying of the metal to the semiconductor surface takes place as the local temperature is a little higher than the semiconductor metal eutectic. Alloying to a maximum depth of approximately 0.3 mil between the metal and semiconductive material is desirable because it assures a certain additional amount of mechanical strength. However the alloying should not go through the diffused layer 12.

Normally the voltage may be maintained across the cathode anode for a period of two to ten seconds. A four second period has been found satisfactory for producing beads of spheres of a size approximately 5 mils in diameter. Spheres of 3 to 10 mils are possible depending on the length of time the voltage is maintained.

After the beads of 3 to 10 mils in diameter have been alloyed to the semiconductor sheet 50 the sheet is removed from the electrochemical bath, washed in dilute acetic acid, then water, then dried. The exposed surface of the oxide mask 55 is then coated with a suitable varnish. This varnish preferably comprises a silicone resin varnish diluted 50% with xylene. Other protective varnishes which are chemically inert and which will form a protective and securing coating may be used. These may include organic water resistant silicone compounds. This varnish layer 80 forms a protective coating which increases the moisture resistance of the diode and additionally, functions to secure the bead in position during subsequent processing. In particular, it aids in preventing the beads from being squashed or deformed when the leads are affixed, and functions in the nature of a jig. This varnish coating preferably has a thickness of approximately .5 mil. It initially covers both the surface of the oxide mask 55 and the bead 20.

After the coating of varnish is dry the back surface 82 of the laminate as illustrated in FIG. 3 is lapped down, preferably to a thickness of approximately 3 mils. The varnish is then abraded from the top of the balls as illustrated at 83 by suitable means.

A layer 18 of indium is then vapor deposited onto the surface 82 of the semiconductor sheet 50. A layer 17 of gold is then vapor deposited onto the indium layer 18. The indium is alloyed into the semiconductor sheet at a temperature of approximately 220° C. which is above the eutectic point of germanium and indium, but below the melting point of tin. Other contacting systems well known in the art may also be used and include for example the substitution of gallium for indium. Care must be taken, however, to form the contact on the surface 82 at temperatures below the melting point of the bead 20. After a low ohmic contacting means are formed on the surface 82 the sheet 50 is diced into individual wafer, each containing at least one aperture 53. These preferably square wafers may, for example, have widths of 29 mils and preferably should have a width several times that of the bead. A width of between 15 and 25 mils is satisfactory.

Conductive leads are then attached to the bear 20 and the surface 86 of the wafer. These leads attached both to the bead 20 and the surface 86 are headed leads having integral heads 27 extending substantially normal to wires 26. The diameter of the heads 27 are preferably no greater than the diameter of the wafer. The diameter of the heads are preferably 18 mils and that of the wire 26 is 10 mils. These leads are preferably copper plated nickel. It has ben found the use of the headed leads at both connections aids in the alignment of the intermediate components. The surfaces 28 of the heads 27 are pretinned with a low temperature solder such as a lead-tin solder. Care should be taken in pretinning the surfaces 86 of the heads to confine the solder to the surface 86 to avoid possible melting through the potting compound which is applied in a subsequent step. The leads are brought into contact respectively with the beads 10 and surface 86 under sufficient pressure and heat to cause a soldered bond. Preferably some alloying takes place so as to provide a more secure junction. Heat up to approximately 260° C. has been found satisfactory for such bonding. The pressure should be at least approximately .05 to .1 gram/sq. cm.

After the leads have been bonded a drop of liquid epoxy or high temperature potting compound such as glass is placed on the structure to form an encapsulation 31. When cured, so that it becomes rigid, this potting compound forms a bond with the leads 26 and thereby encases the entire construction with the ends of the lead projecting.

While the foregoing example describes a preferred embodiment of the present invention when used to form germanium diodes having tin bead contacts, other embodiments of the present invention are contemplated. Thus the present invention is contemplated for use in the manufacture of silicon semiconductive devices. In this process the procedure followed my be substantially the same as that described above. However, tin will not wet silicon readily because silicon dioxide forms on the silicon surface. For that reason an intermediate wetting material must be used. Thus, after rectifying junctions are formed in the silicon sheet 41, as illustrated in FIG. 2, a layer of a suitable wetting agent such as gold, silver, aluminum or nickel is deposited in the aperture of the mask 42 as illustrated at 45. This layer 45 may have a thickness of approximately .1 mil or less but should be sufficiently thick as to wet both the silicon and tin. Following this the bead 40 corresponding with the bead 20 is thermoelectrically chemically deposited and partially alloyed into the silicon in a manner as hereinafter described. The subsequent steps may be the same as described above.

What is claimed is:

1. A diode construction comprising in axial alignment, a pair of headed leads, each comprising a length of conductive wire with an integral head at the end thereof, said heads having parallel inwardly facing surface areas larger than the cross sectional area of said wires and lying in planes normal to the length of said wires, a wafer of semiconductor material having parallel surfaces with a rectifying junction formed therein and lying principally in a plane parallel to and intermediate said surfaces and extending to one of said surfaces, a metallic bead having a melting point lower than said semi-conductor material axially aligned with said lengths of wire and intermediate and electronically connecting in a low ohmic connection one of said surface areas with said one surface of said wafer, a first electrically insulating oxide layer bonded to said one surface of said wafer covering the intersection of said rectifying junction and having an aperture formed therein within which said bead is located, a second electrically insulating layer covering said first layer with an aperture coincident with said first mentioned aperture and with a portion of said second layer engaging and securing said bead, means electronically connecting the other of said surface areas and the other surface of said wafer, and a quantity of potting material encapsulating said semiconductor material and said integral heads.

2. A device as set forth in claim 1 wherein said semiconductor material comprises germanium and said metallic bead has a tin content.

3. A device as set forth in claim 1 wherein solder is deposited on said surface area only and adheres said leads respectively to said bead and said other surface of said wafer.

4. A device as set forth in claim 1 wherein said semiconductor material comprises silicon and said metallic bead has a tin content, with a layer of metal capable of wetting tin and silicon intermediate said bead and semiconductor material.

5. A device as set forth in claim 4 wherein said metal capable of wetting tin and silicon is selected from a group consisting of silver, aluminum, nickel and gold.

References Cited by the Examiner

UNITED STATES PATENTS

| | | | |
|---|---|---|---|
| 2,946,935 | 7/1960 | Finn | 317—234 |
| 2,972,092 | 2/1961 | Nelson | 317—235 |
| 3,047,780 | 7/1962 | Metz | 317—234 |
| 3,081,374 | 3/1963 | Burch | 317—234 X |
| 3,149,396 | 9/1964 | Warren | 317—235 |

FOREIGN PATENTS

| | | |
|---|---|---|
| 1,267,686 | 6/1961 | France. |

JOHN W. HUCKERT, *Primary Examiner.*

GEORGE N. WESTBY, *Examiner.*

R. F. POLISSACK, *Assistant Examiner.*